United States Patent [19]
Martin et al.

[11] Patent Number: 5,451,890
[45] Date of Patent: Sep. 19, 1995

[54] GALLIUM ARSENIDE SOURCE FOLLOWER FET LOGIC FAMILY WITH DIODES FOR PREVENTING LEAKAGE CURRENTS

[75] Inventors: Alain J. Martin; Jose A. Tierno, both of Pasadena; Brian Von Herzen, San Jose, all of Calif.

[73] Assignee: California Institue of Technology, Pasadena, Calif.

[21] Appl. No.: 225,518

[22] Filed: Apr. 11, 1994

Related U.S. Application Data

[63] Continuation of Ser. No. 934,702, Aug. 24, 1992, abandoned.

[51] Int. Cl.[6] .................................. H03K 19/0956
[52] U.S. Cl. ..................................... 326/118; 326/117
[58] Field of Search ................... 307/443, 448, 450; 326/116, 117, 118

[56] References Cited

U.S. PATENT DOCUMENTS

| | | | |
|---|---|---|---|
| 4,404,480 | 9/1983 | Ransom et al. | 307/448 |
| 4,471,238 | 9/1984 | Hickling et al. | 307/450 |
| 4,712,022 | 12/1987 | Vu | 307/448 |
| 4,798,978 | 1/1989 | Lee et al. | 307/448 |
| 4,812,683 | 3/1989 | Fitzpatrick et al. | 307/448 |
| 4,931,670 | 6/1990 | Ting | 307/448 |
| 5,027,007 | 6/1991 | LaRue et al. | 307/448 |

FOREIGN PATENT DOCUMENTS 59-178822  10/1984  Japan .................................. 307/450

OTHER PUBLICATIONS

Chen, John V.; CMOS Devices and Technology for VLSI; ©1990 by Prentice-Hall, Inc.; pp. 92–95.

Primary Examiner—Edward P. Westin
Assistant Examiner—Benjamin D. Driscoll
Attorney, Agent, or Firm—Michael L. Keller; Robert M. Wallace

[57] ABSTRACT

The basic building block of the invention is an inverter gate consisting of two stages: The first stage is an input logic switching stage consisting of a depletion mode pull-up FET whose gate is the input node and whose source-to-drain channel is connected in series through a level-shifting Schottky diode with the source-to-drain channel of an depletion mode pull-down FET between drain and source voltage rails. The source of the pull-up FET is connected to the diode's anode while the drain of the pull-down FET is connected to the diode's cathode and is the output node of the input logic switching stage. The level-shifting diode isolates the output node from the input node, which allows the input voltage to switch rail-to-rail without causing problems. The voltage between the source and drain rails is selected so that the Schottky barrier gate of the enhancement mode pull-up transistor is barely forward biased over the threshold voltage of the Schottky barrier gate junction, so that there is very little current through the gate. The second stage is an inverting stage having an enhancement mode pull-up transistor and a depletion mode pull-down transistor whose source-to-drain channels are connected in series across the source and drain voltage rails. The gate of the pull down transistor is connected to the output node of the logic switching stage, while the source-to-drain connection between the two transistors is the output node of the gate.

24 Claims, 12 Drawing Sheets

GALLIUM ARSENIDE SOURCE FOLLOWER FET LOGIC FAMILY WITH DIODES FOR PREVENTING LEAKAGE CURRENTS

This is a continuation of application Ser. No. 07/934,702 filed Aug. 24, 1994 now abandoned.

BACKGROUND OF THE INVENTION

1. Technical Field

The invention is related to monolithic gallium arsenide field effect transistor (FET) logic circuits and to logic circuit building blocks capable of forming a complete family of logic circuits.

2. Background Art

Various types of gallium arsenide logic circuits try to optimize delays or power consumption or noise margins, but all, in some manner, try to compensate for the gallium arsenide metal semiconductor FET (MESFET) being less than an ideal switch, due to forward conductance through the gate junction. The gate of a MESFET is connected to the channel through a Schottky barrier junction (hence, the gate is referred to as a Schottky barrier gate). In most cases, this causes an interaction between the input and the output of a logic stage comprising the MESFET, or limits the excursion of the input signal, or adds current paths that have to be considered carefully to make sure they do not cause any problems.

Gallium Arsenide FET Logic

Figure 1:
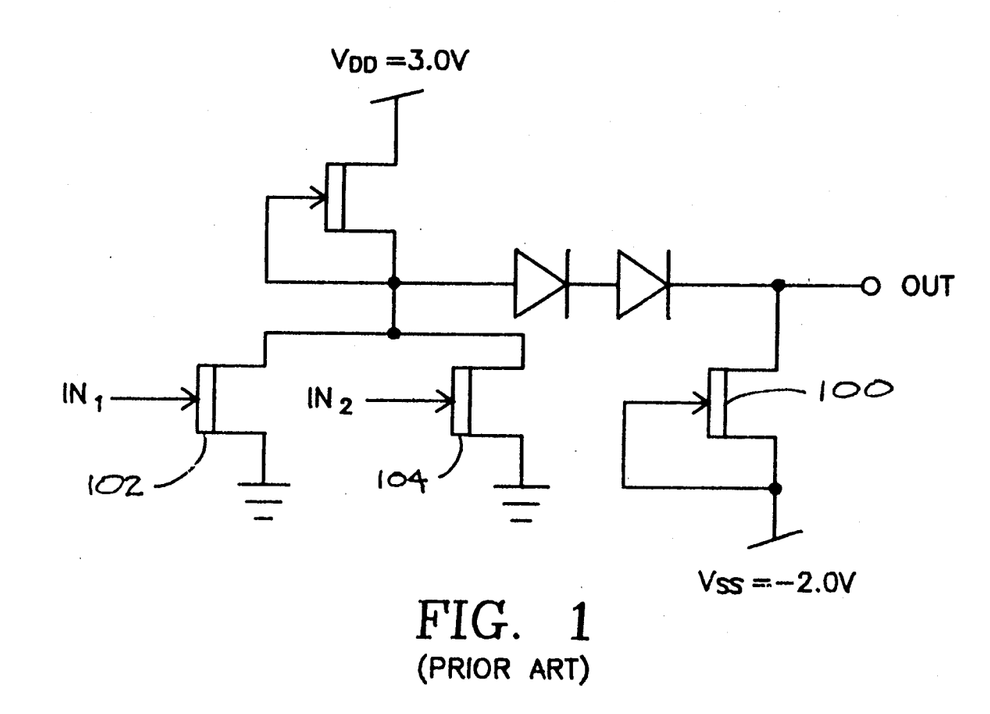
FIG. 1 is a diagram of a FET logic circuit of the prior art.

FIG. 1 shows a conventional FET logic NOR gate consisting of MESFET devices. The output stage, comprising the MESFET 100, can produce a limited amount of current and frequently needs to be buffered. Since the input MESFETS 102, 104 are depletion mode devices and are therefore always on in this circuit, they dissipate a significant amount of static power. NOR gates are the primitive building block for this type of logic circuit. However, their fan-in is quite limited: NAND gates with at most two inputs can be implemented, but they have very small noise margins.

Gallium Arsenide DCFL Logic

Figure 2A:
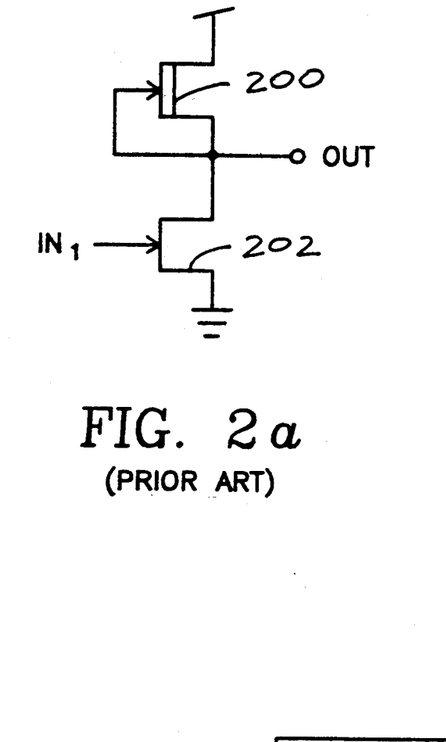
FIGS. 2a, 2b and 2c are diagrams of DCFL circuits of the prior art.
Figure 2B:
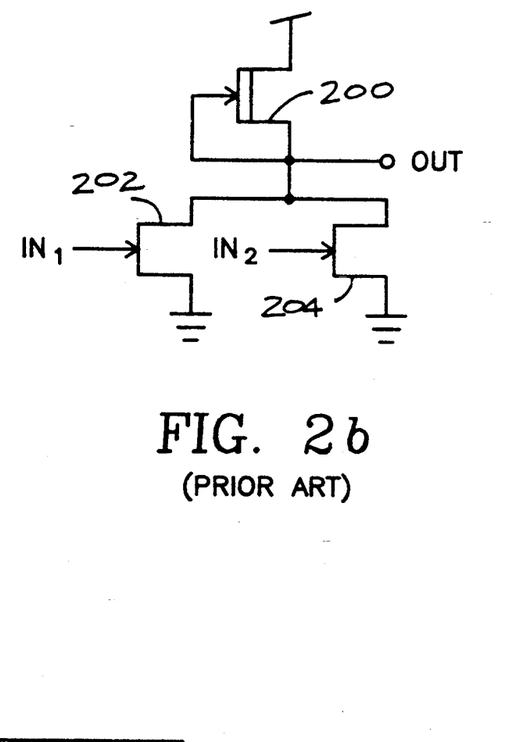

Static power dissipation can be reduced by employing both depletion mode and enhancement mode MESFETs in the same logic circuit. Since source-to-drain current flow in the enhancement mode MESFETs can be completely cut-off, the static power dissipation of the circuit can be minimized. One example of this is direct coupled FET logic (DCFL) circuits of the type illustrated in FIGS. 2a and 2b. FIG. 2a illustrates an inverter and FIG. 2b illustrates a NOR gate. The inverter of FIG. 2a consists of a depletion mode pull-up transistor 200 and an enhancement mode active pull-down transistor 202 whose gate is connected to a logic input signal. A second pull-down transistor 204 is added to this circuit in FIG. 2b to form a NOR gate. Although the DCFL circuits of FIGS. 2a and 2b offer a good tradeoff between power and speed, they suffer from the disadvantage of low noise margin. Furthermore, extra circuitry is required to drive loads consisting of 3 or 4 gates, a significant disadvantage.

Figure 2C:
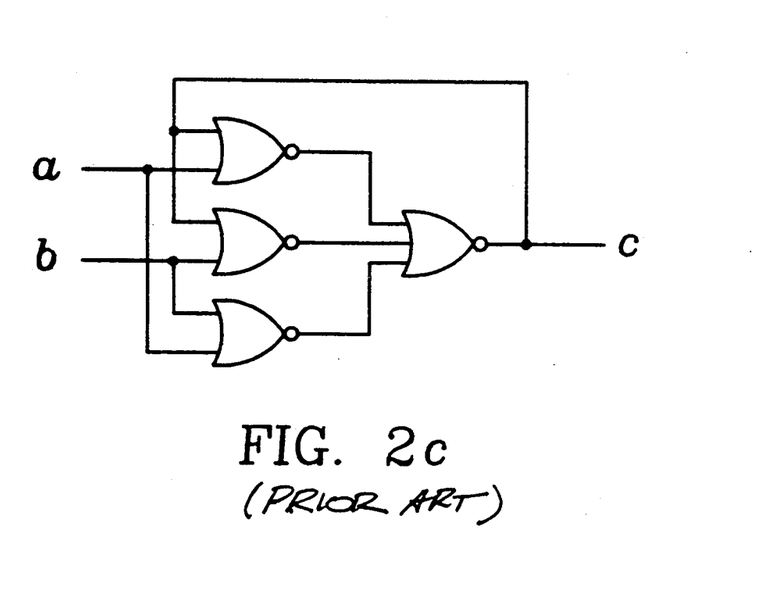

A further disadvantage is that DCFL circuits are not sufficiently reliable for use in asynchronous circuits. One example of an asynchronous circuit is the two-input C-element illustrated in FIG. 2c receiving a pair logic inputs a and b and producing an output c. A C-element is a logic circuit whose output does not change state unless or until all of its inputs have changed to either a logic high or a logic low. If the C-element of FIG. 2c is implemented in DCFL, then a failure can occur for the sequence of logic highs as follows: a a b b. In other words, there is a race condition for the sequence a a b b, and so such a C-element is not reliable for use in high-speed asynchronous circuits.

Figure 3A:
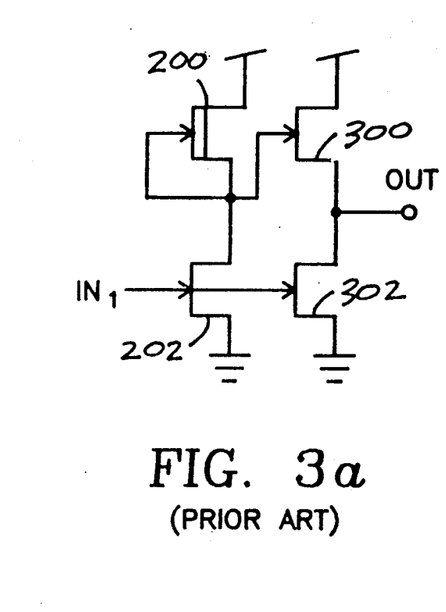
FIGS. 3a and 3b are diagrams of output buffer circuits of the prior art employed with the DCFL circuits of FIGS. 2a and 2b.

For larger loads, performance can be enhanced by employing a buffer stage of the type illustrated in FIG. 3a at the output of the DCFL circuit. The buffer provides some savings in power for similar delays. However, the additional circuit elements require more space on the integrated circuit. The buffering is achieved by a pair of push-pull transistors 300, 302 which do not consume static power. However, there is a moment in the switching transient when both of the push-pull transistors 300, 302 are turned on, so that care has to be taken that the resultant current spike does not create problems in neighboring circuit elements.

When the load is highly capacitive and the fan-out is small, the pull-up transistor 300 will be too large and force the next voltage well above the maximum input voltage of the next gate (not shown). This must be prevented by employing a voltage limiting circuit such as the diode pair 304, 306 illustrated in FIG. 3b.

The DCFL logic circuits disclosed in Matsue et al., "A 5-ns GaAs 16-kb SRAM," *IEEE Journal of Solid-State Circuits*, Vol. 26, No. 10, October 1991, pages 1399–1406, and particularly at page 1400, FIG. 1b thereof, comprise a first or input DCFL stage and a pair of diodes which limit the voltage swing at the input of the next or second stage. The second stage restores the logic levels from the first stage using a pair of depletion mode FETs connected in series. The logic output is taken at the output of this second stage. The third stage, consisting of a depletion mode and enhancement mode FET pair connected in series merely provides a resistive load and therefore performs no logic switching.

Gallium Arsenide FET-FET Logic

Figure 4A:
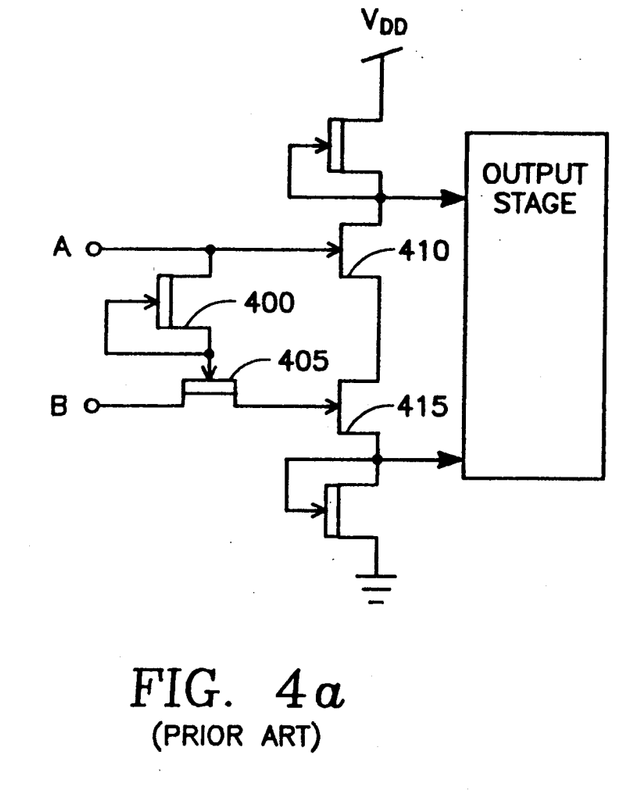
Figure 4B:
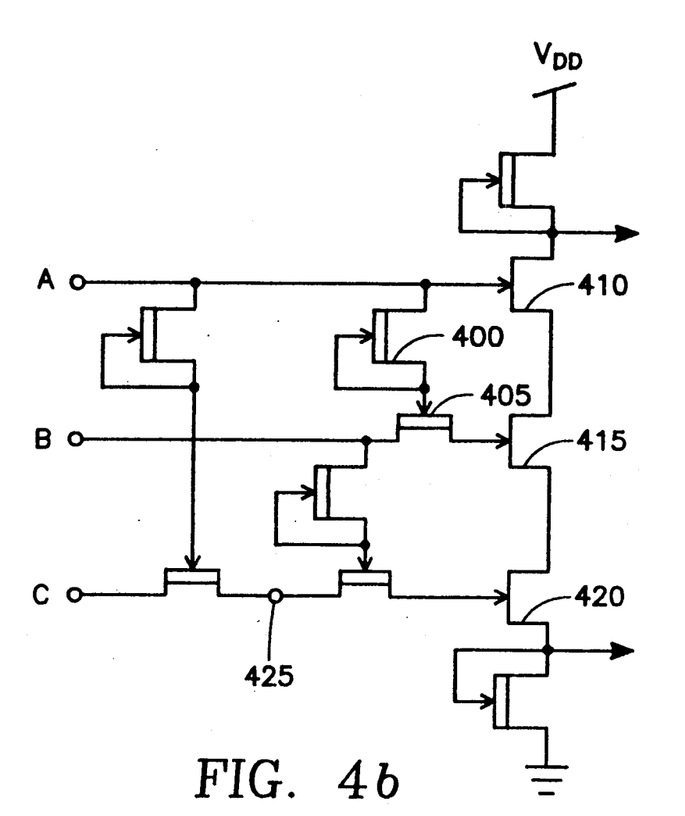

FIG. 4a illustrates a FET-FET logic NAND gate of the type disclosed in LaRue et al., "FET FET Logic: A High Performance, High Noise Margin E/D Logic Family," *GaAs IC Symposium*, IEEE, 1989, pages 223–226. The input transistors 400, 405 prevent a logic high on input B from switching either of the switch transistors 410, 415 without a logic high on input A. However, no more than two inputs can be realized, because any attempt, such as that illustrated in FIG. 4b, to add a third input C and a third switch transistor 420 creates a node 425 which cannot be discharged after all inputs A, B and C change from a logic high to a logic low, thus creating an error at the output. Thus, the fan-in of FET-FET logic circuits is severely limited.

Source Follower FET Logic (SFFL)

Source follower FET logic (SFFL) circuits of the type disclosed in Leung et al., "2K Gate Circuits with 125 ps Gate Delay Using GaAs HFET Technology," *GaAs IC Symposium*, IEEE, 1989, pages 57–59, cannot form a C element of the type described above with reference to FIG. 2c.

In summary, the known MESFET logic circuits are limited in that they require add-on circuits for handling a large fan-out, cannot handle a large fan-in and have limited noise margins. Although certain types of MESFET logic circuits, such as SFFL circuits, do not suffer from certain of the foregoing disadvantages, they are not useful for constructing C-elements. Moreover, the most optimum types of logic circuits relative to power consumption and noise margin, such as DCFL circuits, are not reliable in self-timed circuit elements such as C-elements.

Accordingly, there is a need for a Gallium Arsenide MESFET logic circuit building block or element which forms a complete family of logic circuits and is capable of supporting complex logic structures with large fan-in and large fan-out without limiting the noise margin, and which is reliable in self-timed logic structures such as C-elements.

SUMMARY OF THE INVENTION

The invention is a complete family of Gallium Arsenide MESFET logic circuits for building logic structures with large fan-in and fan-out and which are inherently reliable in asynchronous circuits and which enjoy large noise margin and which can withstand large input voltage swings.

The basic building block of the invention is an inverter gate consisting of two stages: The first stage is an input logic switching stage consisting of a depletion mode pull-up FET whose gate is the input node and whose source-to-drain channel is connected in series through a level-shifting Schottky diode with the source-to-drain channel of an depletion mode pull-down FET between drain and source voltage rails. The source of the pull-up FET is connected to the diode's anode while the drain of the pull-down FET is connected to the diode's cathode and is the output node of the input logic switching stage. The level-shifting diode isolates the output node from the input node, which allows the input voltage to switch rail-to-rail without causing problems, a significant advantage. The voltage between the source and drain rails is selected so that the Schottky barrier gate of the enhancement mode pull-up transistor is barely forward biased over the threshold voltage of the Schottky barrier gate junction, so that there is very little current through the gate.

The second stage is an inverting stage having an enhancement mode pull-up transistor and a depletion mode pull-down transistor whose source-to-drain channels are connected in series across the source and drain voltage rails. The gate of the pull down transistor is connected to the output node of the logic switching stage, while the source-to-drain connection between the two transistors is the output node of the gate. The ratio between sizes of the pull-up and pull-down FETs of the input stage is selected to be between 1 and 2 to optimize performance.

The foregoing structure may support a large fan-in, for example, by replicating the pull-up transistor of the input stage many times, to realize a NOR gate with many inputs. The invention further includes sneak current path blocking which permits series connection of two pull-up transistors in the input stage to realize a NAND gate. This sneak path blocking feature requires that the threshold voltage of the depletion mode FETs is the same as the forward conductance threshold voltage of the level-shifting diode. For NAND gates with large fan-in, parallel enhancement mode input FETs with coupled gates replace the depletion mode pull-up FET, their drains comprising many input nodes and their sources connected to the anode of the level-shifting diode.

All of the foregoing may be combined, replicated and combined again to realize logic structures of varying degrees of complexity and depth not possible in the prior art. In the more complex structures, each minterm has its own level-shifting diode isolating it from all other minterms, thereby cutting off sneak current paths. Various logic structures, particularly those useful in asynchronous circuits such as C-elements, completion trees and multi-input arbiters, are constructed using combinations of the foregoing building blocks, as is described in the detailed description below.

BRIEF DESCRIPTION OF THE DRAWINGS

FIGS. 4a and 4b are diagrams of FET-FET logic circuits, of which FIG. 4a is typical of the prior art while FIG. 4b illustrates a way one might attempt to improve upon the circuit of FIG. 4a.

FIG. 9 illustrates a parallel NAND gate of the invention having large fan-in.

FIG. 10 illustrates a super buffer of the invention related to the buffer circuit of FIG. 3a.

DETAILED DESCRIPTION OF THE INVENTION

Figure 5A:
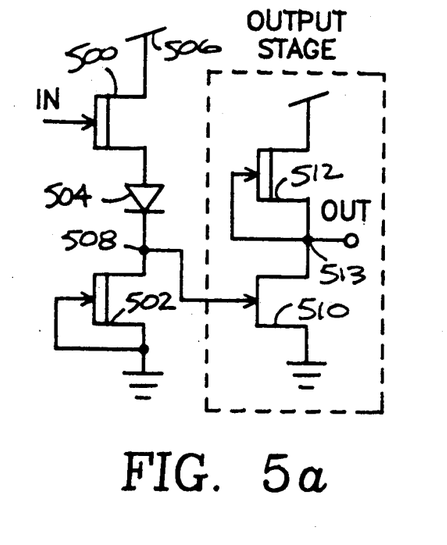
FIGS. 5a and 5b are diagrams of two embodiments of a basic building block circuit of the present invention, corresponding to an inverter and a NOR gate, respectively.

Referring to FIG. 5a, the input stage is a source follower consisting of depletion mode active pull-up and passive pull-down MESFETs 500, 502, respectively, their source-to-drain channels connected through a level-shifting Schottky barrier diode 504 between a drain rail 506 and a source rail (ground). The Schottky barrier gate of the pull-up FET 500 is the input node of the input stage. The source and Schottky barrier gate of the pull-down FET 502 are connected together. The output node 508 of the input stage is isolated from the input node by the level-shifting diode 504, thereby enhancing performance.

The output stage is a DCFL inverter consisting of an active enhancement mode pull-down FET 510 and a passive depletion mode pull-up FET 512, their source-to-drain channels connected in series between the voltage rails. The connection between the FETs 510, 512 is the output node 513 of the output stage.

The voltage of the drain voltage rail 506 is selected to barely forward bias the Schottky gate junction of the active pull-up FET 500, so that very little current flows through that gate. Typically, this requires that the voltage of the drain voltage rail 506 (with respect to ground) be about 3 times the forward conductance threshold voltage of the level shifting diode 504. Alternatively, or in addition thereto, the size of the pull-up FET 500 is selected to be between 1 and 2 times as large as the pull-down FET 502, depending upon the selected transistor and diode parameters and circuit proportions.

NOR Gate

Figure 5B:
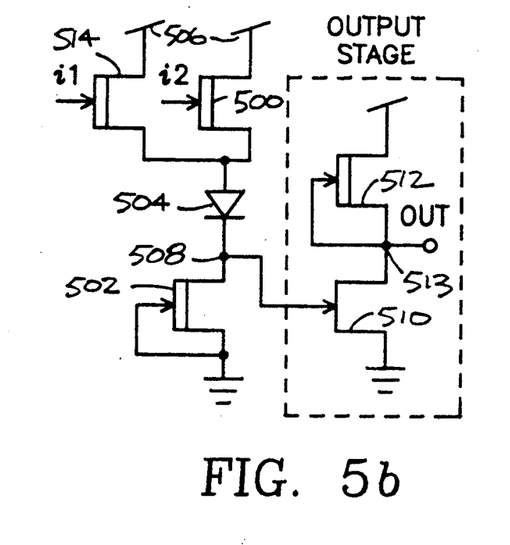

A NOR gate is constructed from the inverter of FIG. 5a by adding a second active depletion mode pull-up FET 514 in parallel with the active depletion mode pull-up transistor 500, as illustrated in FIG. 5b.

NAND Gate

Figure 6:
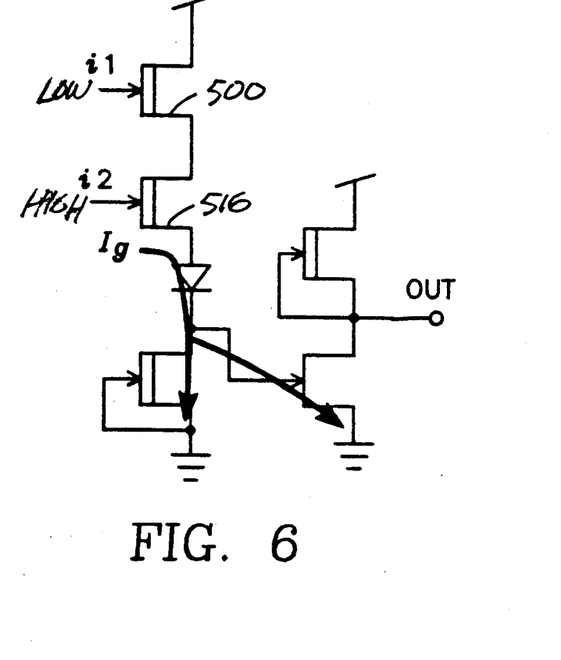
FIG. 6 is a diagram illustrating a sneak current path prevented in the invention.
Figure 7:
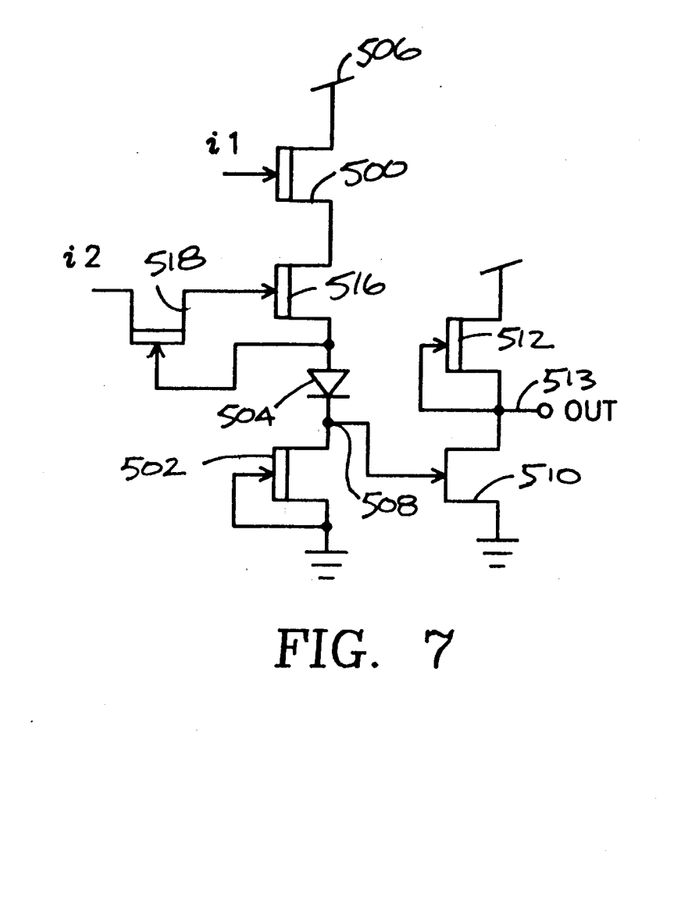
FIG. 7 is a diagram of a NAND gate of the invention in which the sneak current path of FIG. 6 is prevented.

While from the foregoing description it may seem to be expedient to construct a NAND gate from the inverter of FIG. 5a by simply adding a second active depletion mode pull-up FET 516 in series with the pull-up FET 500 as shown in FIG. 6, such a design would permit a strong logic "high" voltage on the gate of the second pull-up FET 516 to cause a current $I_g$ to flow through the forward-biased gate junction of the FET 516 and provide a false "high" even though the input to the first pull-up FET 500 is a logic low, as illustrated in FIG. 6. As illustrated in FIG. 7, the possibility of such a false "high" is prevented in the invention by connecting the source-to-drain channel of a protection FET 518 between the second logic input and the gate of the second pull-up FET 516, and connecting the gate of the protection FET 518 to the source of the second pull-up FET 516. The protection FET 518 enables the second pull-up transistor to be fully turned on by the second logic input only after the first pull-up transistor is turned on by the first logic input, thereby preventing any false logic highs at the output. This feature requires that the threshold voltage $V_T$ of the depletion mode FETs 500, 502 and 512 be approximately the same as the forward conductance threshold voltage $V_D$ of the level-shifting diode 504. Further inputs can be added in this fashion using additional protection FETs in the manner of the protection FET 518 of FIG. 7.

Combinations With Other Inputs

Figure 8A:
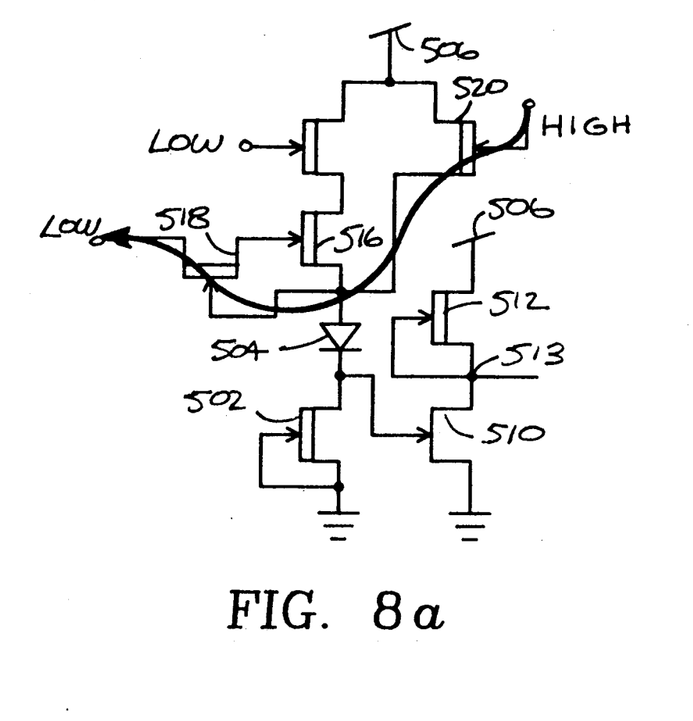
FIGS. 8a, 8b and 8c illustrate the sneak current paths in complex combinations of logic circuit elements of the invention and how they are prevented.
Figure 8B:
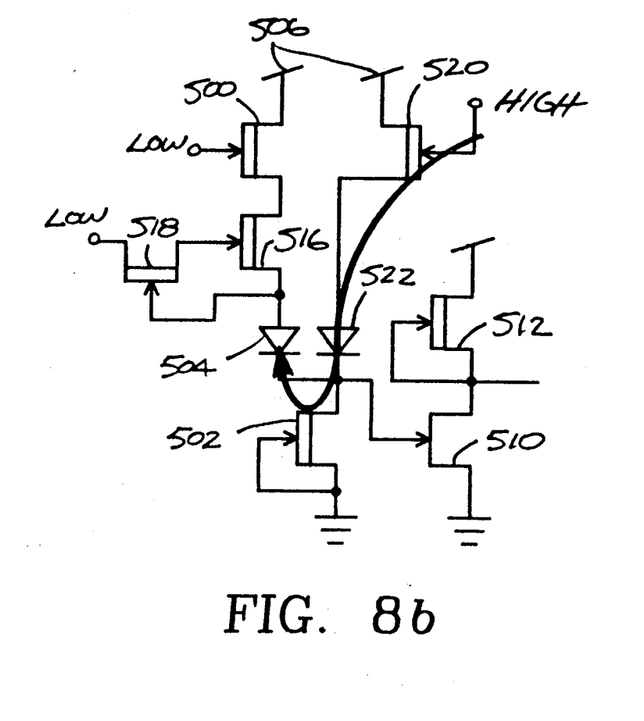

If the two inputs of the NAND gate of FIG. 7 are to be OR'd with a third input prior to inversion, as in NOT[ab OR c], then it would seem expedient to simply connect a third pull-up FET 520 in parallel with the two series-connected pull-up FETs 500, 516 as shown in FIG. 8a. This is an OR sum of two minterms, the first minterm of a and b comprising the pull-up FETs 500 and 516 and the second minterm of c comprising to the third pull-up FET 520. However, the protection FET 518 introduces a conductive path to ground when the second logic input (to the protection FET 518) is low. This path is illustrated in FIG. 8a. The solution to this problem is to provide a separate level-shifting diode 502, 522 for each minterm, as illustrated in FIG. 8b. In the embodiment of FIG. 8b, the level-shifting diodes 504, 522 not only isolate the output from the inputs, as described above, but also block any sneak paths to ground between minterms, as indicated in FIG. 8b.

Figure 8C:
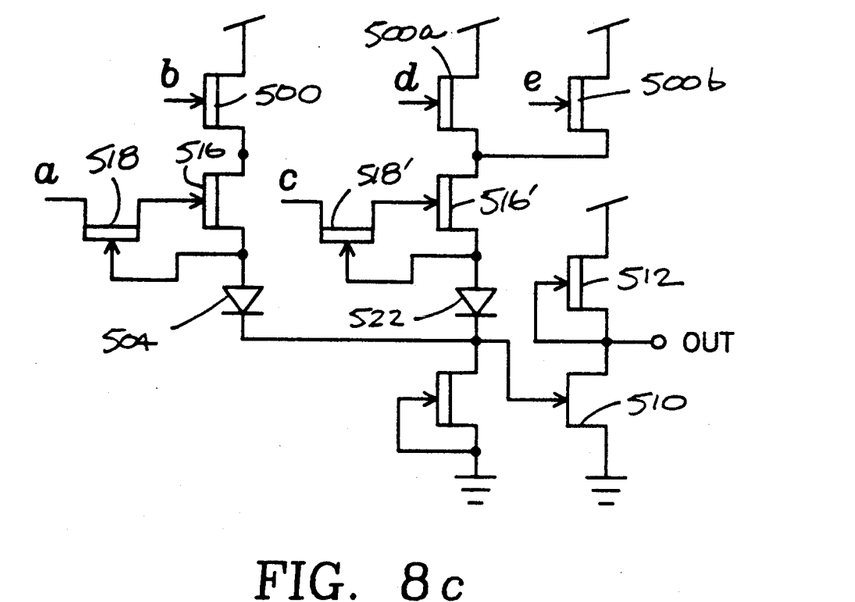

It is not possible to enumerate here all of the possible variations of FIG. 8b. FIG. 8c is an example of just one variation. In FIG. 8c, there are two minterms, each minterm having its own level-shifting diode 504, 522 in accordance with FIG. 8b and each minterm comprising a 2-input AND stage corresponding to FIG. 7, with two pull-up FETs 500a, 500b in one of the minterms and only one pull-up FET 500 in the other minterm.

NAND Gate for Large Fan-In

Figure 9:
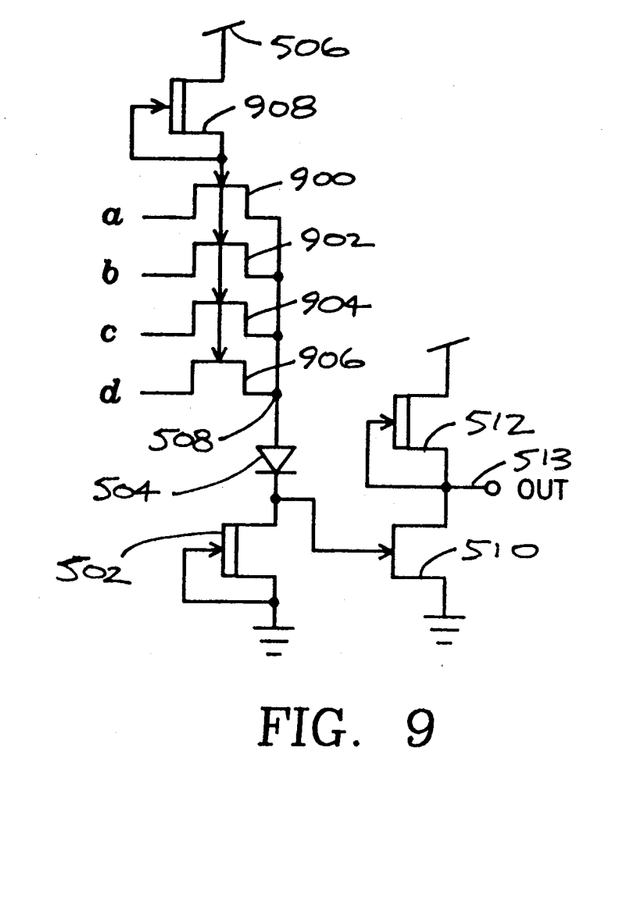

If an extremely large fan-in NAND gate is required, the embodiment of FIG. 9 is preferred. In FIG. 9, the active pull-up FET 500 of FIG. 5a is replaced by plural enhancement mode pull-up FETs 900, 902, 904, 906, etc. having their drains connected to respective logic input signals, their sources connected together and their gates connected to a voltage source which holds the FETs 900–906 fully on. The voltage source is a depletion mode gate bias FET 908 whose drain is connected to the drain voltage rail 506 and whose gate and source are connected to the gates of all of the enhancement mode pull-up FETs 900–906. If the logic input signal to any one of the pull-up FETs 900–906 is off (i.e., near ground potential), this will pull down the gates of all of the other pull-up FETs 900–906 as well as the gate of the bias FET 908, so that the voltage at the output node 508 is pulled low by FET 502. A logic high is achieved only when all of the logic inputs to the pull-up FETs 900–906 are high. While FIG. 9 shows only four logic inputs, many more may be accommodated, depending upon fan-in requirements. This particular embodiment is useful for creating large gates for self-timed logic structures, such as 32-bit completion trees, for example.

Combination With Super Buffer Stage

Figure 10:
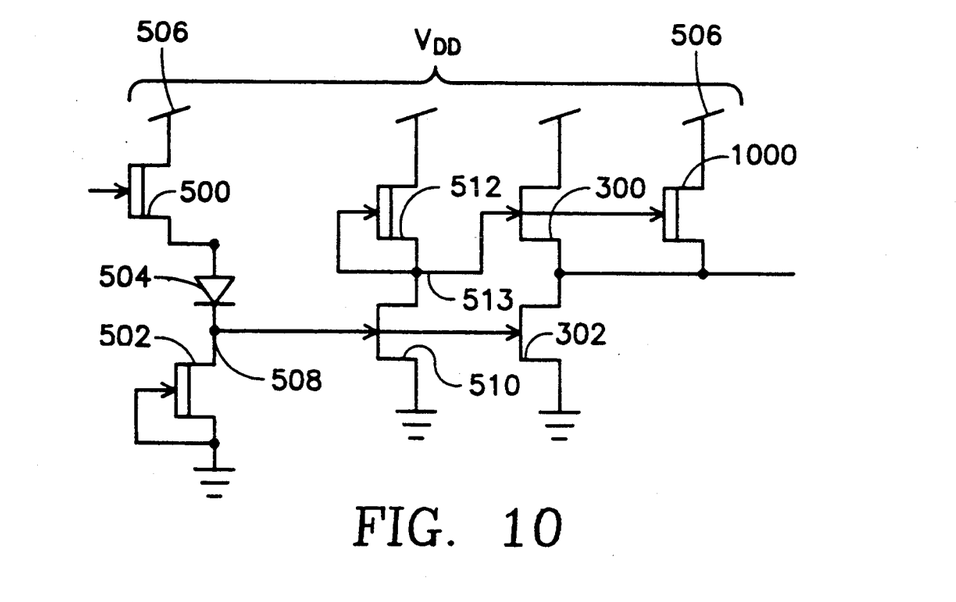

The inverter of FIG. 5a may be combined with a super buffer stage of the invention as illustrated in FIG. 10. The super buffer stage consists of a first buffer stage of the type illustrated in FIG. 3a consisting of the push-pull FETs 300, 302 whose gates are connected to the output nodes 513, 508, respectively. Logic high output voltages are increased by connecting a final output depletion mode pull-up FET 1000 across the output node of the buffer stage 300, 302 and the drain voltage rail 506 as illustrated in FIG. 10. The gate of the pull-up FET 1000 is connected, with the gate of the push-pull FET 300, to the output node 513 of the output stage of the inverter of FIG. 5a. The addition of the pull-up FET 1000 increases the logic high output voltage by one $V_D$.

Figure 3B:
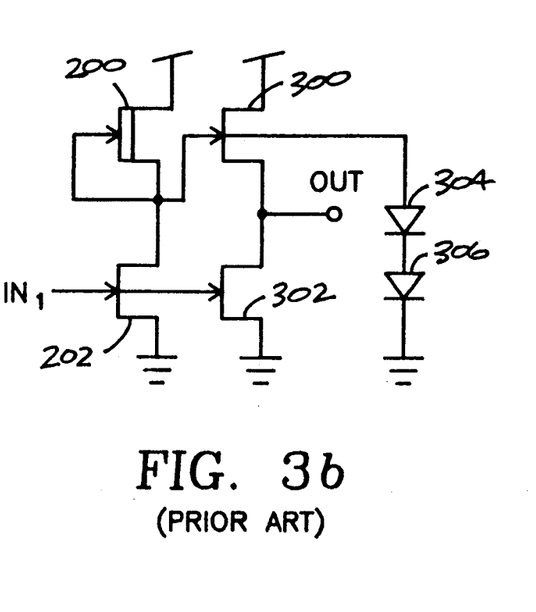

The design and sizing of the super buffer of FIG. 10 is very different from the DCFL buffer of FIGS. 3a and 3b: The load is mostly the capacitive load of the wires. Some extra current is necessary to drive the parallel type NAND inputs in the fan-out.

C-Elements

Figure 11A:
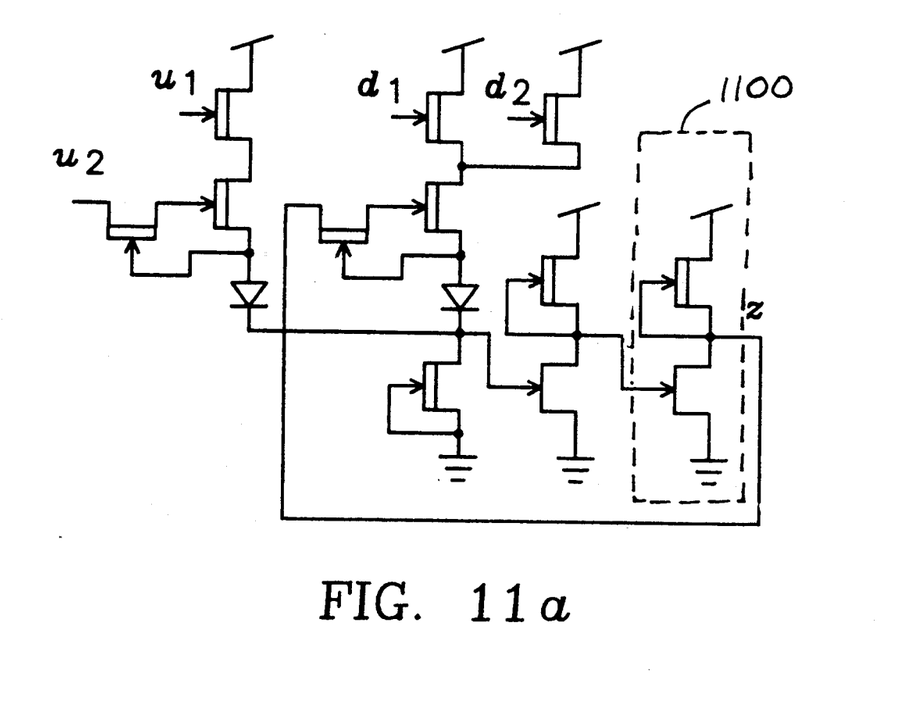
FIGS. 11a and 11b are diagrams of a C-element of the invention.
Figure 11B:
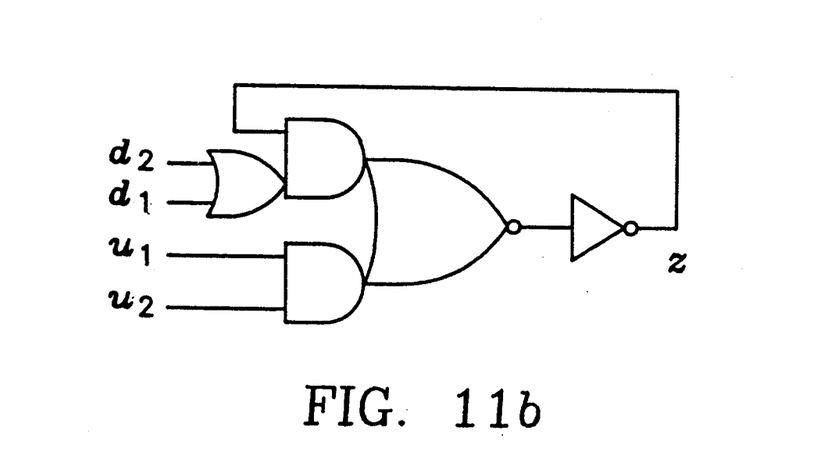

Many of the foregoing elements are employed as building blocks to construct a simple C-element as illustrated in FIG. 11a. In fact, the circuit of FIG. 11a is simply the circuit of FIG. 8c described previously herein, but with a second DCFL inverting stage 1100 cascaded onto the output, the second inverting stage 1100 providing as feedback the logic input corresponding to logic signal d of FIG. 8c. The corresponding logic diagram is illustrated in FIG. 11b.

Figures 12A, 12B:
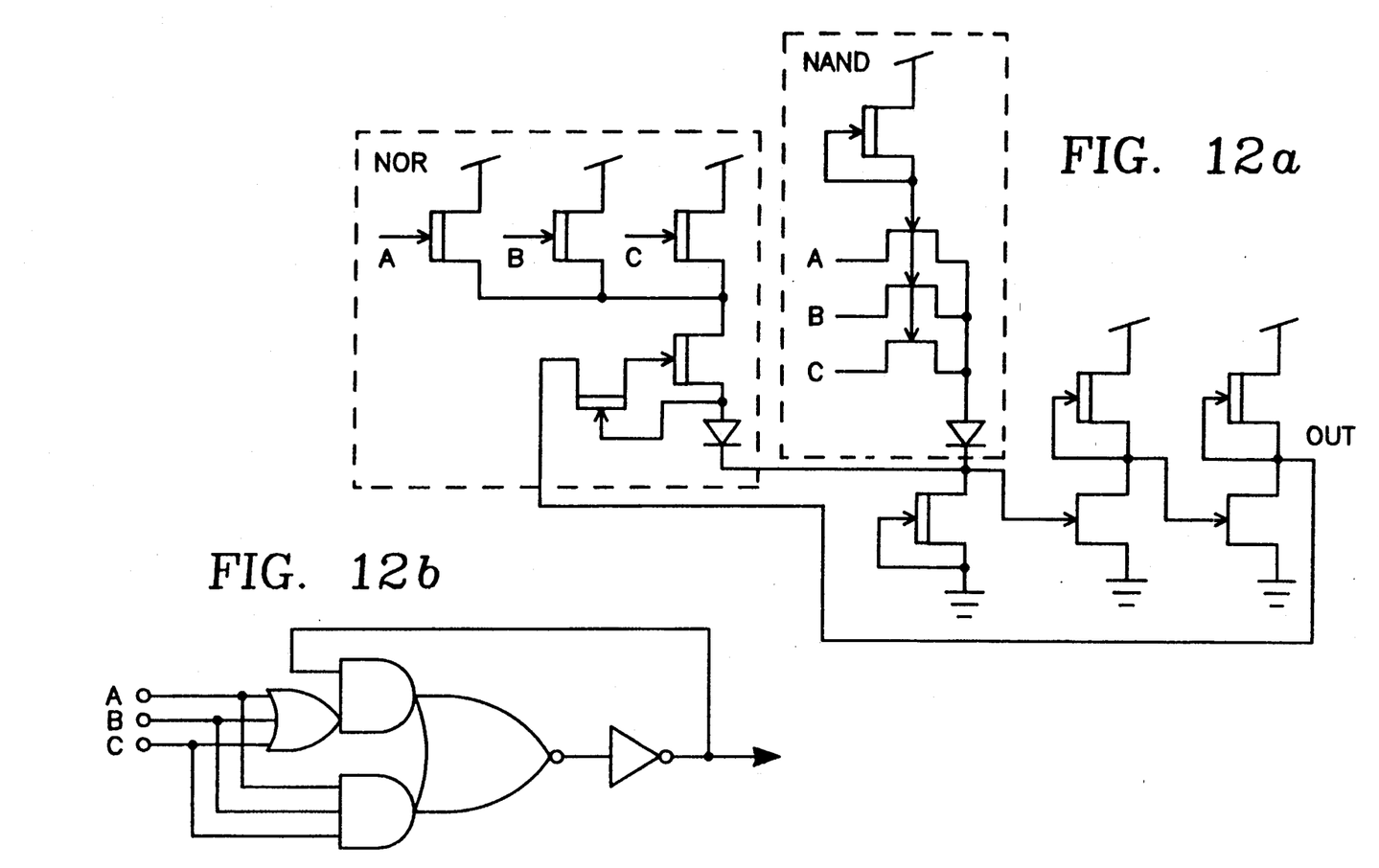
FIGS. 12a and 12b are diagrams of a more complex C-element of the invention.

A three input C-element is illustrated in FIG. 12a employing the parallel NAND gate of FIG. 9 as one pull-up structure and a three input NOR gate of the type corresponding to FIG. 5b as the other pull-up structure. The corresponding logic diagram is illustrated in FIG. 12b.

Figure 13:
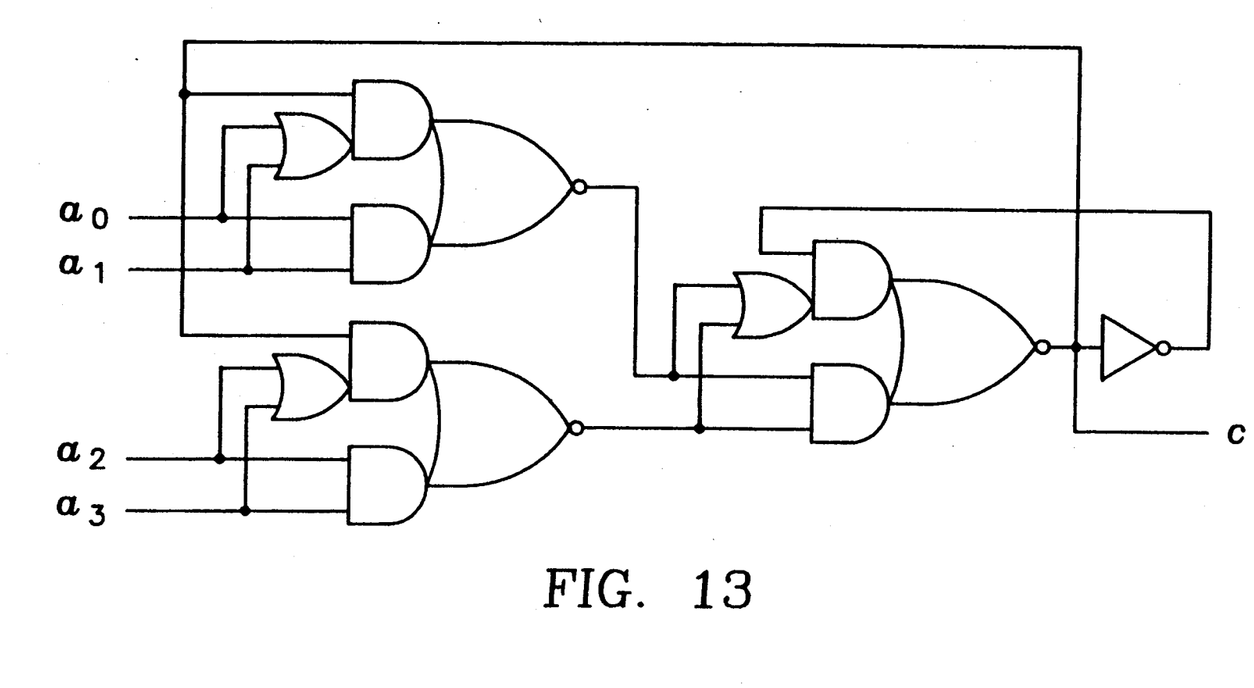
FIG. 13 illustrates how to construct a completion tree using three C-elements of the invention.

FIG. 13 illustrates how to combine three C-elements of the type illustrated in FIG. 12b to construct a four element completion tree. Such completion trees are employed in asynchronous circuits such as those disclosed in U.S. patent application Ser. No. 07/495,835 filed Mar. 19, 1990 by Alain J. Martin et al. entitled ASYNCHRONOUS PROCESSORS and assigned to the present assignee.

Figure 14:
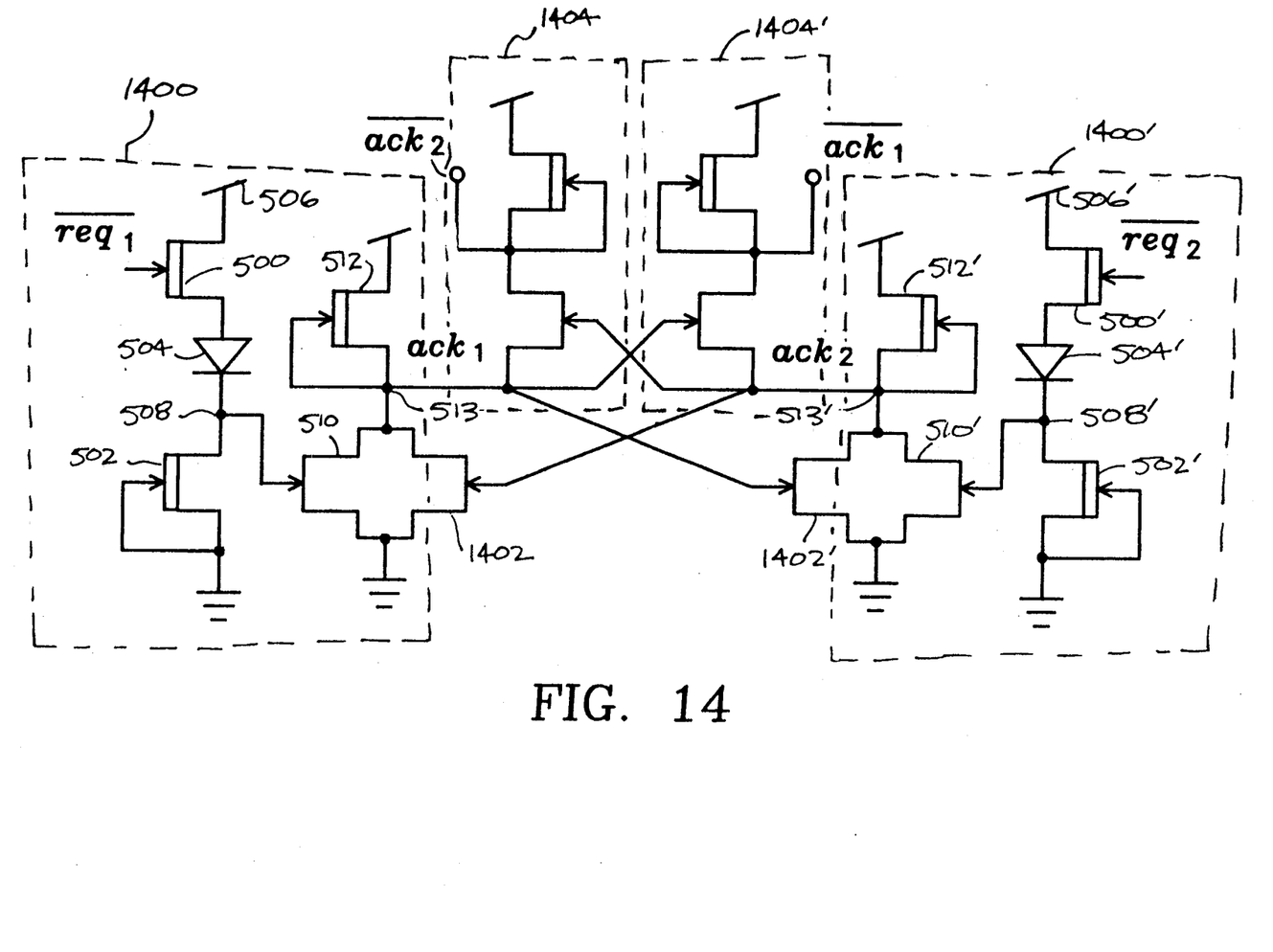
FIG. 14 illustrates an arbiter circuit constructed from logic circuits of the invention.

FIG. 14 illustrates how to construct a two-input arbiter circuit using two copies 1400, 1400' of the inverter of FIG. 5a. The first copy 1400 includes the elements 500–513 described above with reference to FIG. 5a, while the second copy 1400' includes corresponding elements 500'–513' identical in function to the elements 500–513. Each passive pull-down FET 510, 510' of the two copies of the circuit of FIG. 5a has a coupling FET 1402, 1402', respectively, connected thereacross, the gates of the coupling FET's 1402, 1402' being cross-coupled to the output nodes 513', 513, respectively. The outputs of the pair of inverters 1400, 1400' are cross-coupled through a pair of DCFL inverters 1404, 1404' of the type illustrated in FIG. 2a as follows: the input and output of the DCFL inverter 1404 are connected to the output nodes 513' and 513 respectively, while the input and output of the DCFL inverter 1404' are connected to the output nodes 513 and 513', respectively.

The arbiter of FIG. 14 outputs a single acknowledge signal, either ack1 or ack2, in response to two competing request signals, req1 and req2 which may have arrived simultaneously. The output signals go rail-to-rail. The noise in the circuit breaks the symmetry of simultaneously arriving request signals req1 and req2 to produce a single winner.

While the invention has been described in detail by specific reference to preferred embodiments thereof, it is understood that variations and modifications may be made without departing from the true spirit and scope of the invention.

What is claimed is:

1. A logic gate formed of a direct bandgap semiconductor of a class of direct bandgap semiconductors comprising Gallium Arsenide semiconductors, said logic gate comprising:
   (a) a logic switching stage comprising:
      (a1) a first depletion mode active pull-up transistor including a source, a drain and a Schottky barrier gate, wherein the drain of the first depletion mode active pull-up transistor is connected to a drain voltage rail and the Schottky barrier gate of the first depletion mode active pull-up transistor is connected to receive a first logic input signal,
      (a2) a second depletion mode active pull-up transistor including a source, a drain and a Schottky barrier gate, wherein the drain of the second depletion mode active pull-up transistor is connected to the source of said first depletion mode active pull-up transistor,
      (a3) a level-shifting diode having first and second diode terminals, wherein the first diode terminal is connected to the source of said second depletion mode active pull-up transistor and the second diode terminal comprises an output node of the logic switching stage,
      (a4) a depletion mode passive pull-down transistor including a source, a drain and a Schottky barrier gate, wherein the source and the Schottky barrier gate of the depletion mode passive pull-down transistor are connected to a source voltage rail, and wherein the drain of the depletion mode passive pull-down transistor is connected the second diode terminal of said level-shifting diode, and
      (a5) a sneak path prevention transistor having a source-to-drain channel connected in series between the Schottky barrier gate of said second depletion mode active pull-up transistor and a second logic input signal, and wherein a Schottky barrier gate of the sneak prevention transistor is connected to the first diode terminal of said level shifting-diode; and
   (b) a first inverting output stage connected to said output node of said logic switching stage; and wherein
   (c) said logic gate is a nand gate.

2. The logic gate of claim 1 wherein said inverting output stage comprises:
   an enhancement mode active pull-down transistor including a source, a drain and a Schottky barrier gate, said Schottky barrier gate of said enhancement mode active pull-down transistor connected to said output node of said logic switching stage, said source of said enhancement mode active pull-down transistor connected to said source voltage rail,
   a depletion mode passive pull-up transistor including a source, a drain and a Schottky barrier gate, said source of said depletion mode passive pull-up transistor connected to said drain of said enhancement mode active pull-down transistor and to said Schottky barrier gate of said depletion mode passive pull-up transistor and comprising an output node of said logic gate, and said drain of said depletion mode passive pull-up transistor connected to said drain voltage rail.

3. The logic gate of claim 2 wherein a potential difference is maintained between said source and drain voltage rails, and wherein said Schottky barrier gates of said first depletion mode active pull-up transistor and said enhancement mode active pull-down transistor and said level-shifting diode each have a generally constant diode voltage drop thereacross, and wherein said potential difference is greater than said diode voltage drop by a selected factor such as to minimize current flow through said Schottky barrier gate of said first depletion mode active pull-up transistor.

4. The logic gate of claim 2 wherein said level-shifting diode is characterized by a level-shifting diode threshold voltage and wherein each of said first and second depletion mode active pull-up transistors, said depletion mode passive pull-down transistor and said depletion mode passive pull-up transistor have a transistor threshold voltage approximately equal to said level-shifting diode threshold voltage.

5. The logic gate of claim 1 wherein said first depletion mode active pull-up transistor is of approximately between 1 and 2 times as large as said depletion mode passive pull-down transistor, whereby to optimize logic high and logic low voltage levels at said output node of said logic gate.

6. The logic gate of claim 2 further comprising a buffer output stage comprising:
   a pair of push-pull transistors comprising first and second push-pull transistors, said first push-pull transistor having a Schottky barrier gate connected to said output node of said logic gate, a drain connected to said drain voltage rail and a source comprising an output node of said buffer output stage, said second push-pull transistor having a drain connected to said source of said first push-pull transistor, a source connected to said source voltage rail and a Schottky barrier gate connected to said Schottky barrier gate of said enhancement mode active pull-down transistor; and
   a depletion mode active output pull-up transistor having its drain connected to said drain voltage rail, its gate connected to said output node of said logic gate and its source connected to the source of said first push-pull transistor.

7. The logic gate of claim 1 wherein said first and second depletion mode active pull-up transistors comprise a first minterm of said logic gate, said logic switching stage further comprising:
   a second minterm comprising a transistor circuit connected to receive a third input logic signal and connected through a second level-shifting diode to said output node of said logic switching stage, said output node of said logic switching stage comprising a wired-or node of said first and second minterms, whereby said level-shifting diodes prevent sneak current paths between said minterms.

8. The logic gate of claim 7 wherein said transistor circuit of said second minterm comprises a third active pull-up transistor having a drain connected to said drain voltage rail, a source connected to said second level-shifting diode and a Schottky barrier gate connected to receive said third input logic signal.

9. The logic gate of claim 7 wherein said transistor circuit of said second minterm comprises a pair of depletion mode active pull-up transistors having their gates connected to receive third and fourth logic input signals and their sources and drains connected in series between said drain voltage rail and said second level-shifting diode and means for preventing current flow from the gate to the source of one of said pair of depletion mode active pull-up transistors whenever the other one of said pair of depletion mode active pull-up transistors is off.

10. The logic gate of claim 9 wherein said logic switching stage further comprises an additional depletion mode active pull-up transistor having its gate connected to receive a fifth logic input signal, its drain connected to said drain voltage rail and its source connected to a node connecting the drain of one of said pair of depletion mode active pull-up transistors to the source of the other one of said pair.

11. The logic gate of claim 10 further comprising a second inverting output stage having an input connected to an output of said first inverting output stage and an output comprising said second logic input signal, whereby said logic gate comprises a C-element.

12. A logic gate formed of a direct bandgap semiconductor of a class of direct bandgap semiconductors comprising Gallium Arsenide semiconductors, said logic gate comprising:
   a logic switching stage comprising:
      a depletion mode active pull-up transistor including a source, a drain and a Schottky barrier gate, said drain of the depletion mode active pull-up transistor connected to a drain voltage rail, and said Schottky barrier gate of the depletion mode active pull-up transistor connected to receive a logic input signal,
      a depletion mode passive pull-down transistor including a source, a drain and a Schottky barrier gate, said source and said Schottky barrier gate of the depletion mode passive pull-down transistor: connected to a source voltage rail,
      a level-shifting diode having first and second diode terminals, the first diode terminal connected to said source of the depletion mode active pull-up transistor and the second diode terminal connected to said drain of the depletion mode passive pull-down transistor and comprising an output node of said logic switching stage; and
   a first inverting output stage connected to said output node of said logic switching stage, wherein said depletion mode active pull-up transistor and depletion mode passive pull-down transistor comprise a first minterm of said logic gate, said logic switching stage further comprising:
      a second minterm comprising a transistor circuit connected to receive a third input logic signal and connected through a second level-shifting diode to said output node of said logic switching stage, said output node of said logic switching stage comprising a wired-or node of said first and second minterms, whereby said level-shifting diodes prevent sneak current paths between said minterms.

13. The logic gate of claim 12 wherein said inverting output stage comprises:
   an enhancement mode active pull-down transistor including a source, a drain and a Schottky barrier gate, said Schottky barrier gate of said enhancement mode active pull-down transistor connected to said output node of said logic switching stage, said source of said enhancement mode active pull-down transistor connected to said source voltage rail,
   a depletion mode passive pull-up transistor including a source, a drain and a Schottky barrier gate, said source of said depletion mode passive pull-up transistor connected to said drain of said enhancement mode active pull-down transistor and to said Schottky barrier gate of said depletion mode passive pull-up transistor and comprising an output node of said logic gate, and said drain of said depletion mode passive pull-up transistor connected to said drain voltage rail.

14. The logic gate of claim 13 further comprising a buffer output stage comprising:
   a pair of push-pull transistors comprising first and second push-pull transistors, said first push-pull transistor having a Schottky barrier gate connected to said output node of said logic gate, a drain connected to said drain voltage rail and a source comprising an output node of said buffer output stage, said second push-pull transistor having a drain connected to said source of said first push-pull transistor, a source connected to said source voltage rail and a Schottky barrier gate connected to said Schottky barrier gate of .said enhancement mode active pull-down transistor; and
   a depletion mode active output pull-up transistor having its drain connected to said drain voltage rail, its gate connected to said output node of said logic gate and its source connected to the source of said first push-pull transistor.

15. The logic gate of claim 13 wherein a potential difference is maintained between said source and drain voltage rails, and wherein each of said Schottky barrier gate of the depletion mode active pull-up transistor. Schottky barrier gate of said enhancement mode active pull-down transistor and said level-shifting diode has a generally constant diode voltage drop thereacross, and wherein said potential difference is greater than said diode voltage drop by a selected factor such as to minimize current flow through said Schottky barrier gate of the depletion mode active pull-up transistor.

16. The logic gate of claim 13 wherein said level-shifting diode is characterized by a level-shifting diode threshold voltage and wherein each of said depletion mode active pull-up transistor, said depletion mode passive pull-down transistor and said depletion mode passive pull-up transistor have a transistor threshold voltage approximately equal to said level-shifting diode threshold voltage.

17. The logic gate of claim 12 wherein said depletion mode active pull-up transistor is of approximately between 1 and 2 times as large as said depletion mode passive pull-down transistor, whereby to optimize logic high and logic low voltage levels at said output node of said logic gate.

18. The logic gate of claim 12 wherein said logic switching stage further comprises a second depletion mode active pull-up transistor having its source and drain connected to said source and drain of the depletion mode active pull,up transistor respectively and its gate connected to receive a second logic input signal, whereby said logic gate is a nor gate.

19. The logic gate of claim 12 wherein said transistor circuit of said second minterm comprises a third active pull-up transistor having a drain connected to said drain voltage rail, a source connected to said second level-shifting diode and a Schottky barrier gate connected to receive said third input logic signal.

20. The logic gate of claim 12 wherein said transistor circuit of said second minterm comprises a pair of depletion mode active pull-up transistors having their gates connected to receive third and fourth logic input signals and their sources and drains connected in series between said drain voltage rail and said second level-shifting diode and means for preventing current flow from the gate to the source of one of said pair of depletion mode active pull-up transistors whenever the other one of said pair of depletion mode active pull-up transistors is off.

21. The logic gate of claim 20 wherein said logic switching stage further comprises an additional depletion mode active pull-up transistor having its gate connected to receive a fifth logic input signal, its drain connected to said drain voltage rail and its source connected to a node connecting the drain of one of said pair of depletion mode active pull-up transistors to the source of the other one of said pair.

22. The logic gate of claim 21 further comprising a second inverting output stage having an input connected to an output of said first inverting output stage and an output comprising said third logic input signal, whereby said logic gate comprises a C-element.

23. A C-element logic circuit formed of a direct band-gap semiconductor of the type including Gallium Arsenide, said C-element logic circuit comprising:
a logic switching stage comprising:
a first pull-up structure comprising:
plural depletion mode active pull-up transistors each including a first source, a first drain and a first Schottky barrier gate, said first drain connected to a drain voltage rail, said first Schottky barrier gate connected to receive a respective one of plural first logic input signals, said first sources being connected together and comprising an or-node,
a second depletion mode active pull-up transistor having a second source, a second drain and a second Schottky barrier gate, said second drain connected to said or-node and said second gate coupled to receive a second logic input signal,
a depletion mode passive pull-down transistor including a third source, a third drain and a third Schottky barrier gate, said third source and said third Schottky barrier gate connected to a source voltage rail,
a first level-shifting diode having a first diode terminal connected to said second source and a second diode terminal connected to said third drain and comprising an output node of said logic switching stage,
means for preventing current flow from said second gate to said second source whenever each of said first depletion mode active pull-up transistors is off;
a second pull-up structure comprising:
a depletion mode gate-bias transistor including a fourth source, a fourth drain and a fourth Schottky barrier gate, said fourth drain connected to a drain voltage rail, said fourth Schottky barrier gate connected to said fourth source,
plural active enhancement mode pull-up transistors having their drains connected to receive plural respective third logic input signals, their gates connected to said fourth source and their sources connected together and comprising an and-node,
a second level-shifting diode having a third diode terminal connected to said and-node and a fourth diode terminal connected to said output node of said logic switching stage; and
means for producing said second logic signal from a logic signal corresponding to said output node of said logic switching stage.

24. The C-element of claim 23 wherein said means for producing comprise a first inverting output stage connected to said output node of said logic switching stage and a second inverting output stage having an input connected to an output of said first inverting output stage and an output comprising said second logic input signal, wherein said first inverting output stage comprises:
an enhancement mode active pull-down transistor including a third source, a third drain and a third Schottky barrier gate, said third Schottky barrier gate connected to said output node of said logic switching stage, said third source connected to said source voltage rail,
a depletion mode passive pull-up transistor including a fourth source, a fourth drain and a fourth Schottky barrier gate, said fourth source connected to said third drain, to said fourth Schottky barrier gate and to an output node of said logic gate, and said fourth drain connected to said drain voltage rail.

* * * * *